US006287713B1

(12) United States Patent
Heuer et al.

(10) Patent No.: US 6,287,713 B1
(45) Date of Patent: Sep. 11, 2001

(54) ELECTROLUMINESCENT ASSEMBLIES CONTAINING BORON CHELATES

(75) Inventors: Helmut Werner Heuer; Rolf Wehrmann, both of Krefeld; Andreas Elschner, Mülheim, all of (DE)

(73) Assignee: Bayer Aktiengesellschaft, Leverkusen (DE)

( * ) Notice: Subject to any disclaimer, the term of this patent is extended or adjusted under 35 U.S.C. 154(b) by 0 days.

(21) Appl. No.: 09/342,952

(22) Filed: Jun. 29, 1999

(30) Foreign Application Priority Data

Jul. 4, 1998 (DE) .............................. 198 29 947

(51) Int. Cl.$^7$ ..................................... H05B 33/14
(52) U.S. Cl. ........................ 428/690; 428/691; 428/704; 428/917; 313/503; 313/504; 313/506; 313/507; 313/498
(58) Field of Search ................... 428/690, 691, 428/917, 704; 313/503, 504, 506, 507, 498

(56) References Cited

U.S. PATENT DOCUMENTS

| 4,539,507 | 9/1985 | VanSlyke et al. | 313/504 |
|---|---|---|---|
| 4,769,292 | 9/1988 | Tang et al. | 428/690 |
| 4,923,774 | 5/1990 | Van der Auweraer et al. | 430/59 |
| 4,959,430 | 9/1990 | Jonas et al. | 339/257 |
| 4,987,042 | 1/1991 | Jonas et al. | 339/213 |
| 5,077,142 | 12/1991 | Sakon et al. | 428/690 |
| 5,154,769 | 10/1992 | Kuske et al. | 440/459 |
| 5,164,005 | 11/1992 | Kuske et al. | 440/459 |
| 5,300,575 | 4/1994 | Jonas et al. | 440/186 |
| 5,484,922 * | 1/1996 | Moore et al. | 546/7 |
| 5,554,450 | 9/1996 | Shi et al. | 428/690 |
| 5,766,515 | 6/1998 | Jonas et al. | 686/500 |
| 5,965,281 * | 10/1999 | Cao | 428/690 |

FOREIGN PATENT DOCUMENTS

| 2259563 | 1/1998 | (CA) . |
|---|---|---|
| 4211459 | 10/1993 | (DE) . |
| 196 27 070 | 1/1998 | (DE) . |
| 0 278 757 | 8/1988 | (EP) . |
| 0 278 758 | 8/1988 | (EP) . |
| 0 294 061 | 12/1988 | (EP) . |
| 0 443 861 | 8/1991 | (EP) . |
| 0 406 762 | 11/1991 | (EP) . |
| 0 532 798 | 3/1993 | (EP) . |
| 92/16023 | 9/1972 | (WO) . |
| 90/13148 | 11/1990 | (WO) . |
| 92/03490 | 3/1992 | (WO) . |
| 92/03491 | 3/1992 | (WO) . |

OTHER PUBLICATIONS

Bayer's Product Information (Trial Product AI 4071, Sep., 1995).*
Advanced Materials, G. Leising et al (month unavailable) 1992, No. 1, pp. 36–37, No Month "Realization of a Blue–Light–Emitting Device using Poly(p–phenylene)".
Friend et al J. Chem. Soc. Chem Commun. 32, (month unavailable) 1992, pp. 32–24 No Month "Synthesis of a Segmented Conjugated Polymer Chain Giving a Blue–shifted Electroluminescence and Improved Efficiency".
Saito et al, Polymer, Jun. 1990, pp. 1137–1141, vol. 31 "Polyarylenevinylene films prepared from precursor polymers soluble in organic solvents".
Friend et al Physical Review B, vol. 42, No. 18, Dec. 15, 1990, pp. 11670–11681 "Photoexcited states in poly(p–Phenylene vinylene): comparison with trans, trans–distyry, a model oligomer".
M. Stolka et al, Pure & Applied Chem, vol. 62, No. 1, (month unavailable) 1995, pp. 175–182 "Electrouminescence from single layer molecularly doped polymer films".
H. Bassler et al., Advanced Materials (month unavailable) 1995, 7, No. 6, pp. 551–554 "Efficient Two Layer LEDs on a Polymer Blend Basis".
K. Nagai et al, Appl. Phys. Letter, 67(16) (month unavailable) 1995, pp. 2281–2283 "Single–layer white light–emitting organic electroluminescent devices based on dye–dispersed poly(N–vinylcarbazole)".
Naito et al, J. Phy. Chem, Feb., 1993, 97, pp. 6240–6248 "Molecular Design for Nonpolymeric Organic Dye Glasses with Thermal Stability: Relations between Thermodyamic Parameters and Amorphous Properties".
Adachi et al, Appl. Phys. Lett 66(20), May 15, 1995, pp. 2679–2681 "Molecular design of hole transport materials for obtaining high durability in organic electroluminescent diodes".
Hohaus et al, Chem. Ber. 102, (month unavailable)1969, pp. 4025–4031 "Borchelate mit Chelatbildnern der Pyridin–und Chinolin–Reihe und ihren N–Oxiden".
Houben–Weyl Methoden der organischem Chemie, vol. E20, Makromolekulare Stoffe, Part 2 (1987), pp. 1141–1143, Dr. Gunter Schroder, "von Acryl–Verbindungen".
Houben–Weyl, 4/1C, 14–102 (date unavailable), Pro Zymalkowski "A. Katalytische Hydrierung".
Ullmanns, Encyclopadie, Encyklopadie der technischen Chemie, 4, vol. 13, Brocker, "Hydrierung und Dehydrierung, Katalytische" (English translation attached).

* cited by examiner

*Primary Examiner*—Cynthia H. Kelly
*Assistant Examiner*—Ling Xu
(74) *Attorney, Agent, or Firm*—Joseph C. Gil; Richard E. L. Henderson

(57) ABSTRACT

Electroluminescent assembly comprising a substrate, an anode, an electroluminescent element and a cathode, where at least one of the two electrodes is transparent in the visible spectral region and the electroluminescent element contains one or more zones selected from the group consisting of hole injection zone, hole transport zone, electroluminescent zone, electron transport zone and electron injection zone in the order specified, where each of the zones present may also assume functions of the other zones mentioned, characterized in that the electroluminescent element contains a boron complex of an 8-hydroxyquinoline derivative.

12 Claims, No Drawings

ELECTROLUMINESCENT ASSEMBLIES CONTAINING BORON CHELATES

An electroluminescent (EL) assembly is characterized in that it emits light and an electric current flows when an electric potential is applied. Such assemblies have long been known in industry under the name "light emitting diodes" (LEDs). The emission of light results from recombination of positive charges (holes) and negative charges (electrons) with emission of light.

In the development of light-emitting components for electronics or photoelectronics, use is at present made mainly of inorganic semiconductors such as gallium arsenide. Dot-shaped display elements can be produced on the basis of such substances. Large-area assemblies are not possible.

Apart from light emitting semiconductor diodes, electroluminescent assemblies based on vapour-deposited low molecular weight organic compounds are known (U.S. Pat. Nos. 4,539,507, 4,769,262, 5,077,142, EP-A 0 406 762, EP-A 0 278 758, EP-A 0 278 757).

Furthermore, polymers such as poly-(p-phenylenes) and poly-(p-phenylene-vinylenes) (PPVs) have been described as electroluminescent polymers: G. Leising et al., Adv. Mater. 4 (1992) No. 1; Friend et al., J. Chem. Soc., Chem. Commun. 32 (1992); Saito et al., Polymer, 1990, Vol. 31, 1137; Friend et al., Physical Review B, Vol. 42, No. 18, 11670 or WO 90/13148. Further examples of PPV in electroluminescent displays are described in EP-A 0 443 861, WO-A 92/03490 and 92/03491.

EP-A 0 294 061 discloses an optical modulator based on polyacetylene.

To produce flexible polymer LEDs, Heeger et al. have proposed soluble, conjugated PPV derivatives (WO-A 92/16023).

Polymer blends of different compositions are likewise known: M. Stolka et al., Pure & Appt. Chem., Vol. 67, No. 1, pp 175–182, 1995; H. Bässler et al., Adv. Mater. 1995, 7, No. 6, 551; K. Nagai et al., Appl. Phys. Lett. 67 (16), 1995, 2281; EP-A 0 532 798.

The organic EL assemblies generally contain one or more layers comprising organic charge transport compounds. The in-principle structure in the order of the layers is as follows:
1 Support, substrate
2 Base electrode
3 Hole injection layer
4 Hole transport layer
5 Light-emitting layer
6 Electron transport layer
7 Electron injection layer
8 Top electrode
9 Contacts
10 Covering, encapsulation.

Layers 3 to 7 represent the electroluminescent element.

This structure represents the most general case and can be simplified by leaving out individual layers so that one layer assumes a plurality of functions. In the simplest case, the EL assembly comprises two electrodes between which there is located one organic layer which fulfils all functions, including the emission of light. Such systems are described, for example, in the Application WO-A 90/13148 on the basis of poly(p-phenylene-vinylene).

Multilayer systems can be built up by means of vapour deposition processes in which the layers are applied successively from the gas phase or by means of casting processes. Owing to the higher process speeds, casting processes are preferred. However, partial dissolution of a layer which has already been applied when the next layer is applied on top of it can in certain cases be a difficulty.

It is an object of the present invention to provide electroluminescent assemblies having a high light flux, in which novel boron complexes or chelates having improved solubility in customary solvents are to be used as emitters and/or electron conductors. These novel boron complexes should also be able to be applied from the gas phase by means of vapour deposition processes.

It has been found that electroluminescent assemblies containing the boron complexes mentioned below meet these requirements. In the following, the term "zone" is equivalent to the term "layer".

The present invention accordingly provides electroluminescent assemblies comprising a substrate, an anode, an electroluminescent element and a cathode, where at least one of the two electrodes is transparent in the visible spectral region and the electroluminescent element contains one or more zones selected from the group consisting of hole injection zone, hole transport zone, electroluminescent zone, electron transport zone and electron injection zone in the order specified, where each of the zones present may also assume functions of the other zones mentioned, characterized in that the electroluminescent element contains a boron complex of 8-hydroxyquinoline derivatives.

The hole injection zone preferably contains an uncharged or cationic polythiophene of the formula (I)

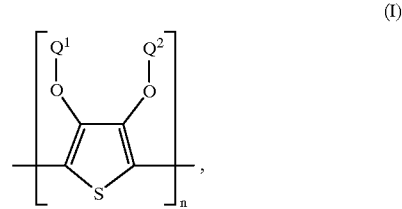

where $Q^1$ and $Q^2$ represent, independently of one another, hydrogen, substituted or unsubstituted $(C_1-C_{20})$-alkyl, $CH_2OH$ or $(C_6-C_{14})$-aryl or $Q^1$ and $Q^2$ together represent —$(CH_2)_m$—$CH_2$— where m=0 to 12, preferably 1 to 5, $(C_6-C_{14})$-arylene, and n represents an integer from 2 to 10,000, preferably from 5 to 5000.

The hole conduction zone adjoining the hole injection zone preferably contains one or more aromatic tertiary amino compounds, preferably substituted or unsubstituted triphenylamine compounds, particularly preferably 1,3,5-tris(aminophenyl)benzene compounds of the formula (II).

The zone or zones located between the hole injection zone and the cathode can also assume a plurality of functions, i.e. one zone can contain, for example, hole-injecting, hole-transporting, electroluminescent, electron-transporting and/or electron-injecting substances.

The electroluminescent element can additionally contain one or more transparent polymeric binders.

The substituted or unsubstituted 1,3,5-tris(aminophenyl) benzene compound preferably represents an aromatic tertiary amino compound of the general formula (II)

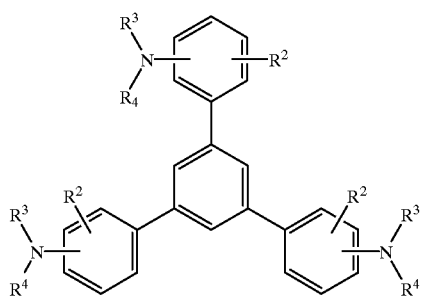

(II)

where

R² represents hydrogen, substituted or unsubstituted alkyl or halogen,

R³ and R⁴ represent, independently of one another, substituted or unsubstituted $(C_1-C_{10})$-alkyl, alkoxycarbonyl-substituted $(C_1-C_{10})$-alkyl or substituted or unsubstituted aryl, aralkyl or cycloalkyl, R³ and R⁴ preferably represent, independently of one another, $(C_1-C_6)$-alkyl, in particular methyl, ethyl, n- or iso-propyl, n-, iso-, sec- or tert-butyl, $(C_1-C_4)$-alkoxycarbonyl-$(C_1-C_6)$-alkyl, for example methoxycarbonyl-, ethoxycarbonyl-, propoxycarbonyl- or butoxycarbonyl-$(C_1-C_4)$-alkyl or unsubstituted or $(C_1-C_4)$-alkyl- and/or $(C_1-C_4)$-alkoxy-substituted phenyl-$(C_1-C_4)$-alkyl, naphthyl-$(C_1-C_4)$alkyl, cyclopentyl, cyclohexyl, phenyl or naphthyl.

Particularly preferably, R³ and R⁴ represent, independently of one another, unsubstituted phenyl or naphthyl or else phenyl or naphthyl substituted by from one to three methyl, ethyl, n-, iso-propyl, methoxy, ethoxy, n- and/or iso-propoxy radicals.

R² preferably represents hydrogen, $(C_1-C_6)$-alkyl, for example methyl, ethyl, n- or iso-propyl, n-, iso-, sec- or tert-butyl, or chlorine.

Such compounds and their preparation are described in U.S. Pat. No. 4,923,774 for use in electrophotography; this patent is hereby expressly incorporated by reference into the present description. The tris-nitrophenyl compound can, for example, be converted into the tris-aminophenyl compound by generally known catalytic hydrogenation, for example in the presence of Raney nickel (Houben-Weyl 4/1C, 14–102. Ullmann (4) 13, 135–148). The amino compound is reacted with substituted halogenobenzenes in a generally known manner.

The following compounds may be mentioned by way of example:

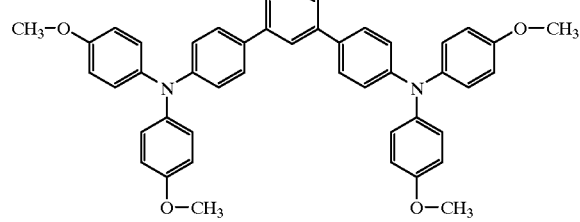

A1

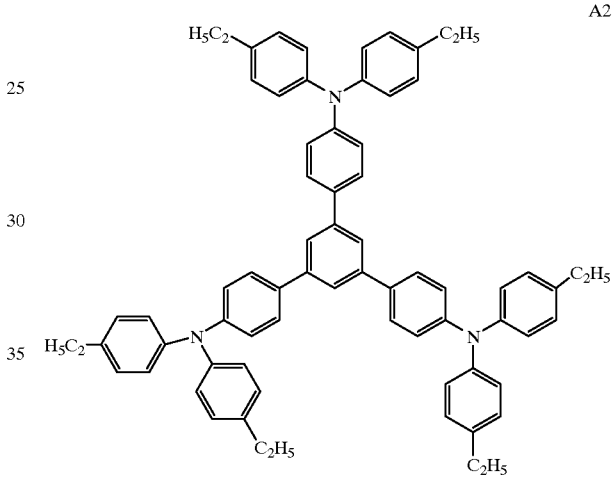

A2

Apart from the tertiary amino compound, further hole conductors, e.g. in the form of a mixture with the tertiary amino compound, may also be used for building up the electroluminescent element. The further hole conductor or conductors can be, on the one hand, one or more compounds of the formula (II), including mixtures of isomers, or, on the other hand, mixtures of hole transport compounds with compounds of tertiary amino compounds having the general formula (II) and having various structures.

A listing of possible hole injection and hole conductor materials is given in EP-A 0 532 798.

In the case of mixtures of the aromatic amines, the compounds can be used in any ratio.

Examples which may be mentioned are:

Materials which have hole-conducting properties and can be used in pure form or as mixing partners for the tertiary amino compounds are, for example, the following compounds, where $X^1$ to $X^6$ represent, independently of one another H, halogen, alkyl, aryl, alkoxy, aryloxy.

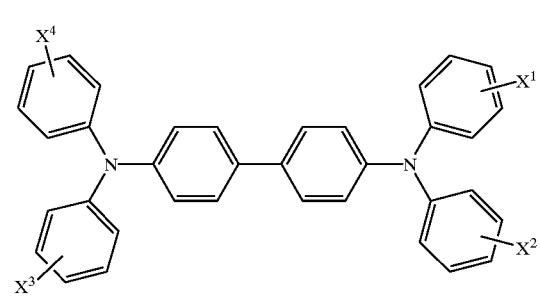
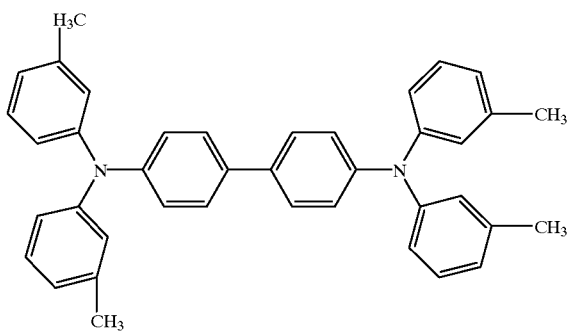
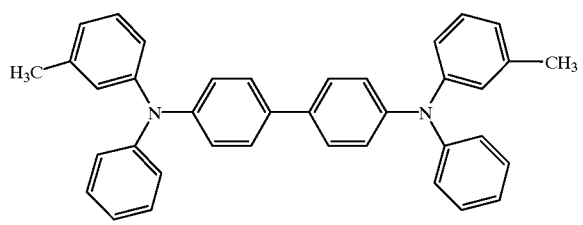
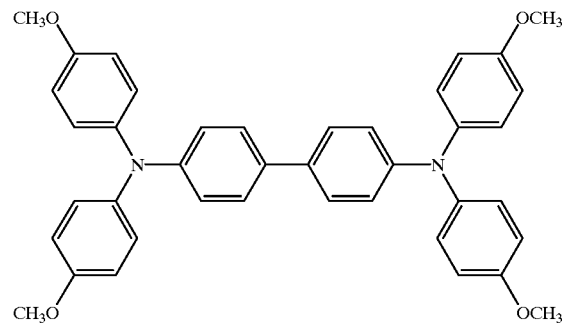
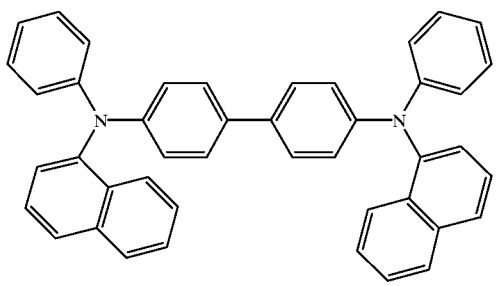
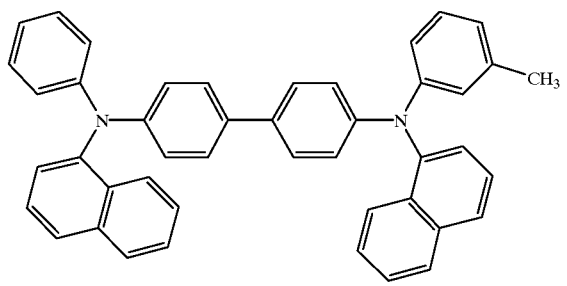
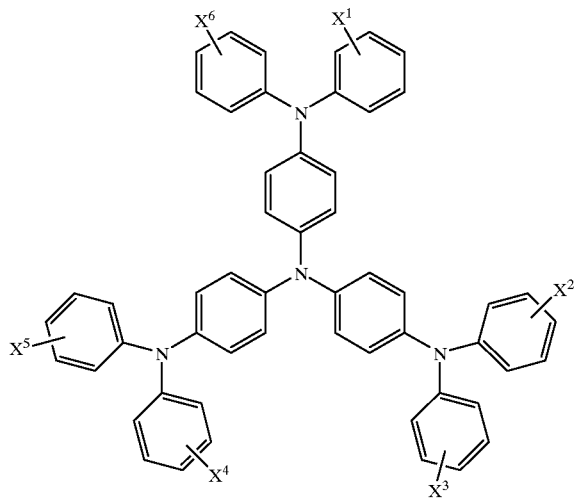
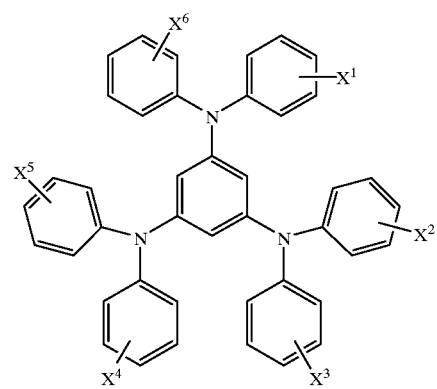

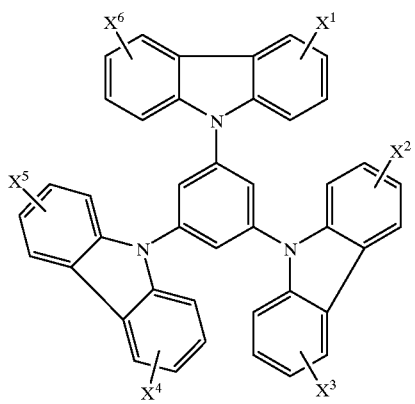
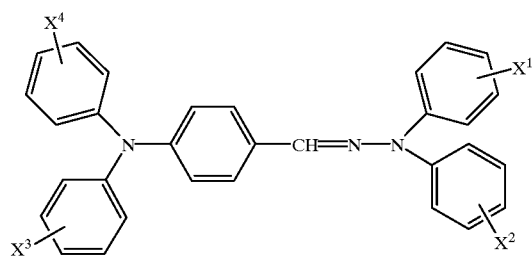
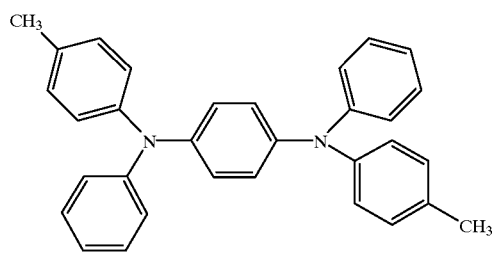
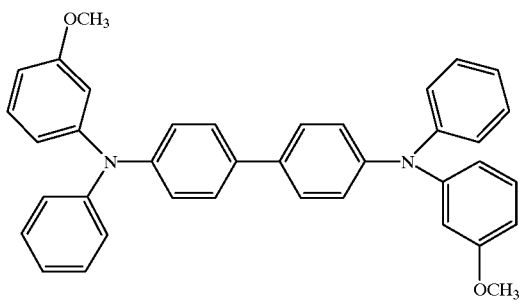
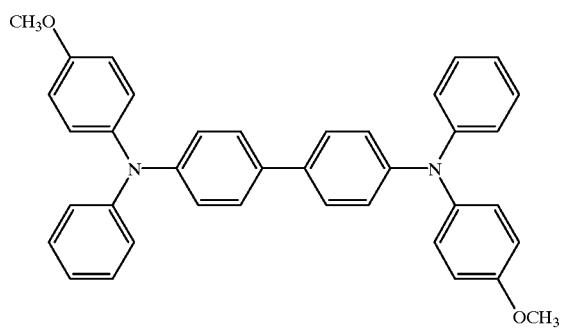
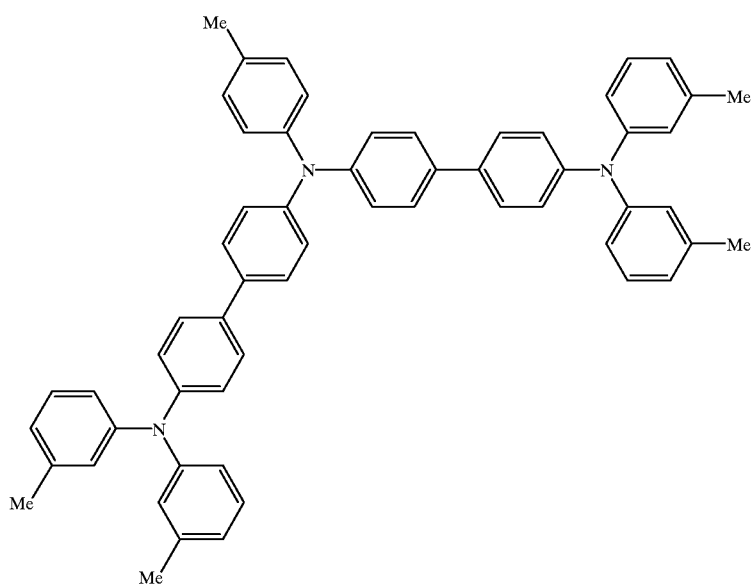

-continued
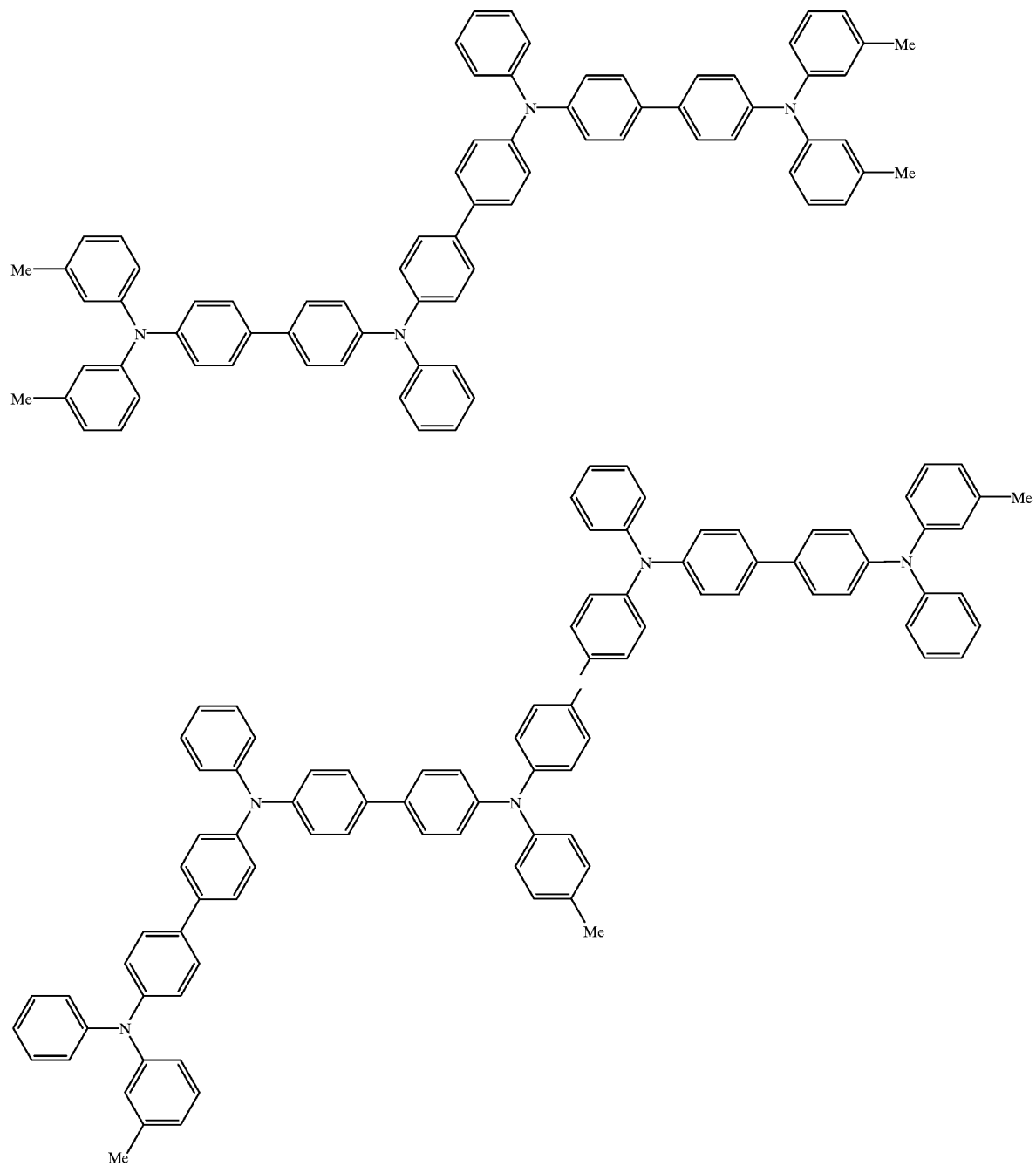

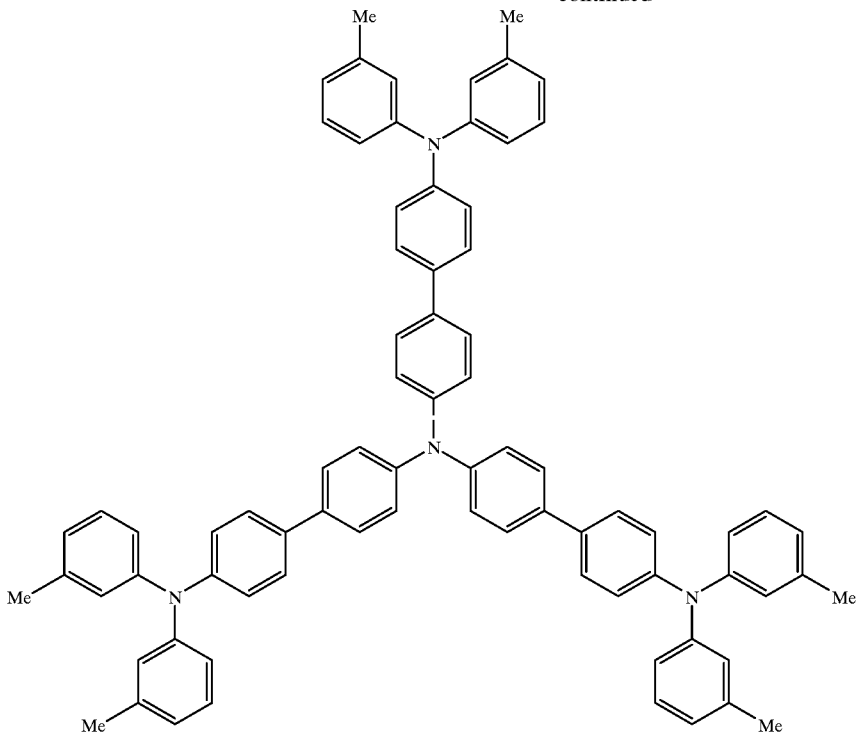

Me=methyl

These and further examples are described in J. Phys. Chem. 1993, 97, 6240–6248 and Appl. Phys. Lett., Vol. 66, No. 20, 2679–2681.

In general, various amines having different basic structures and/or different substitution patterns can be mixed.

$X^1$ to $X^6$ preferably represent, independently of one another, hydrogen, fluorine, chlorine, bromine, $(C_1-C_{10})$-, in particular $(C_1-C_4)$-alkyl or -alkoxy, phenyl, naphthyl, phenoxy and/or naphthyloxy. The aromatic rings may be substituted by one, two, three or four, identical or different radicals $X^1$ to $X^6$.

The polythiophenes having the structural repeating unit of the formula (I) are known (cf. EP-A 0 440 958 and 0 339 340). The preparation of the dispersions or solutions used according to the invention is described in EP-A 0 440 957 and DE-A 42 11 459.

The polythiophenes in the dispersion or solution are preferably used in cationic form as are obtained, for example, by treatment of the neutral thiophenes with oxidizing agents. Customary oxidizing agents such as potassium peroxodisulphate are used for the oxidation. The oxidation gives the polythiophenes positive charges which are not in the formulae since their number and position cannot be determined unambiguously. They can be prepared directly on supports using the methods described in EP-A 0 339 340.

$Q^1$ and $Q^2$ in formula (I) are preferably —$(CH_2)_m$—$CH_2$— where m=1 to 4, very particularly preferably ethylene.

Preferred cationic or neutral polydioxythiophenes comprise structural units of the formula (Ia) or (Ib)

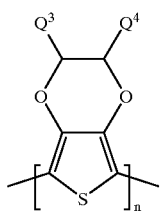
(Ia)

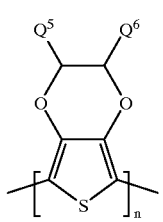
(Ib)

where $Q^3$ and $Q^4$ represent, independently of one another, hydrogen, substituted or unsubstituted $(C_1-C_{18})$-alkyl, preferably $(C_1-C_{10})$-, in particular $(C_1-C_6)$-alkyl, $(C_2-C_{12})$-alkenyl, preferably $(C_2-C_8)$-alkenyl, $(C_3-C_7)$-cycloalkyl, preferably cyclopentyl or cyclohexyl, $(C_7-C_{15})$-aralkyl, preferably phenyl-$(C_1-C_4)$-alkyl, $(C_6-C_{10})$-aryl, preferably phenyl or naphthyl, $(C_1-C_{18})$-alkoxy, preferably $(C_1-C_{10})$-alkoxy, preferably methoxy, ethoxy, n- or iso-propoxy, or $(C_2-C_{18})$-alkyloxy ester and $Q^5$ and $Q^6$ represent, independently of one another, hydrogen or $(C_1-C_{18})$-alkyl, preferably $(C_1-C_{10})$-, in particular $(C_1-C_6)$-alkyl, $(C_2-C_{12})$-alkenyl, preferably $(C_2-C_8)$-alkenyl, $(C_3-C_7)$-cycloalkyl, preferably cyclopentyl or cyclohexyl, $(C_7-C_{15})$-aralkyl, preferably phenyl-$(C_1-C_4)$-alkyl, $(C_6-C_{10})$-aryl, preferably phenyl or naphthyl, $(C_1-C_{18})$-alkoxy, preferably $(C_1-C_{10})$-alkoxy, for example methoxy, ethoxy, n- or iso-propoxy, or $(C_2-C_{18})$-alkyloxy ester which are each substituted by at least one sulphonate group, where if $Q^5$ represents hydrogen, $Q^6$ is not hydrogen and vice versa, and n represents an integer from 2 to 10,000, preferably from 5 to 5000.

Particular preference is given to cationic or uncharged polythiophenes of the formulae (Ia-1) and (Ib-1)

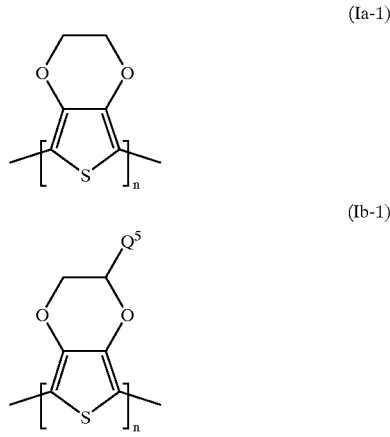

where $Q^5$ and n are as defined above.

To balance the positive charge, the cationic form of the polythiophenes contains anions, preferably polyanions.

Polyanions present are preferably the anions of polymeric carboxylic acids such as polyacrylic acids, polymethacrylic acid or polymaleic acids and polymeric sulphonic acids such as polystyrenesulphonic acids and polyvinylsulphonic acids. These polycarboxylic and polysulphonic acids can also be copolymers of vinylcarboxylic and vinylsulphonic acids with other polymerizable monomers such as acrylates and styrene.

The anion of polystyrenesulphonic acid is particularly preferred as counterion.

The molecular weight of the polyacids forming the polyanions is preferably from 1000 to 2,000,000, particularly preferably from 2000 to 500,000. The polyacids or their alkali metal salts are commercially available, e.g. polystyrenesulphonic acids and polyacrylic acids, or else can be prepared by known methods (see, for example, Houben-Weyl, Methoden der organischen Chemie, Volume E 20 Makromolekulare Stoffe, Part 2 (1987), p. 1141 ff.).

In place of the free polyacids required for the formation of the dispersions of polydioxythiophenes and polyanions, it is also possible to use mixtures of alkali metal salts of the polyacids and corresponding amounts of monoacids.

In the case of the formulae (Ib) and (Ib-1), the polydioxythiophenes bear positive and negative charges in the monomer unit itself.

The assemblies of the invention may, if desired, contain polymers and/or copolymers as binder, for example polycarbonates, polyester carbonates, copolymers of styrene such as SAN or styrene-acrylates, polysulphones, polymers based on vinyl-containing monomers such as poly(meth)acrylates, polyvinylpyrrolidone, polyvinylcarbazol, vinyl acetate and vinyl alcohol polymers and copolymers, polyolefins, cyclic olefin copolymers, phenoxy resins, etc. It is also possible to use mixtures of various polymers. The polymeric binders have molecular weights of from 10,000 to 2,000,000 g/mol, are soluble and film-forming and are transparent in the visible spectral region. They are described, for example, in Encyclopedia of Polymer Science and Engineering, 2nd ed., A. Wiley-Interscience publication. They are usually used in an amount of up to 95% by weight, preferably up to 80% by weight, based on the total weight of the electroluminescent elements.

The boron complex (boron chelate) is preferably a compound of the general formula (IIa) or (IIb)

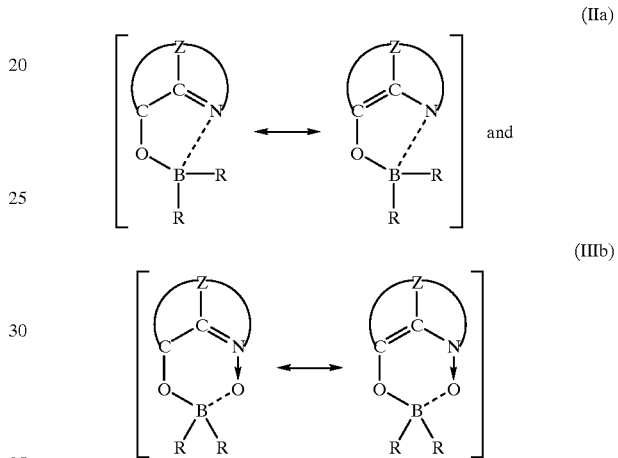

where

Z represents, independently in the two forms, atoms which complete a structure comprising at least 2 fused rings, and R represents an aryl radical or an F atom.

Z completes a heterocyclic molecule section which comprises at least two fused rings of which one is an azole or azine ring, where further, additional aliphatic or aromatic rings may be attached to the two fused rings. In addition, further aliphatic radicals or halogen atoms may be attached to the rings.

The compound (III) particularly preferably represents a compound of the general formula (IIIc) or (IIId)

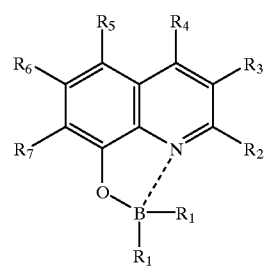

-continued (IIId)

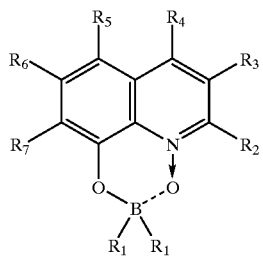

where

R$_1$ represents substituted or unsubstituted (C$_6$–C$_{10}$)-aryl or halogen,

R$_2$, R$_3$, R$_4$, R$_5$, R$_6$ and R$_7$ represent, independently of one another, hydrogen, substituted or unsubstituted (C$_1$–C$_{16}$)-alkyl or halogen or sulphonamido or cyano or a substituted or unsubstituted amino group.

The compound (III) very particularly preferably represents a compound of the general formula (IIIe), (IIIf) or (IIIg)

(IIIe)

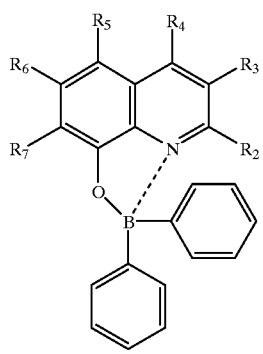

(IIIf)

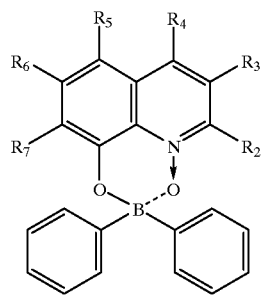

(IIIg)

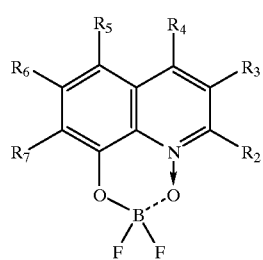

where

R$_2$, R$_3$, R$_4$, R$_5$, R$_6$ and R$_7$ represent, independently of one another, in particular hydrogen, branched or unbranched (C$_1$–C$_{12}$)-alkyl, for example methyl, ethyl or 4-ethyl-1-methyloctyl, or chlorine or a sulphonamido radical or cyano or a substituted amino group.

Such compounds and their preparation are known as fluorescent compounds in chemical analysis and are described, for example, in E. Hohaus, F. Umland; Chem. Ber. 102. 4025–4031 (1969).

A general synthesis scheme which differs only in the choice of solvent is:

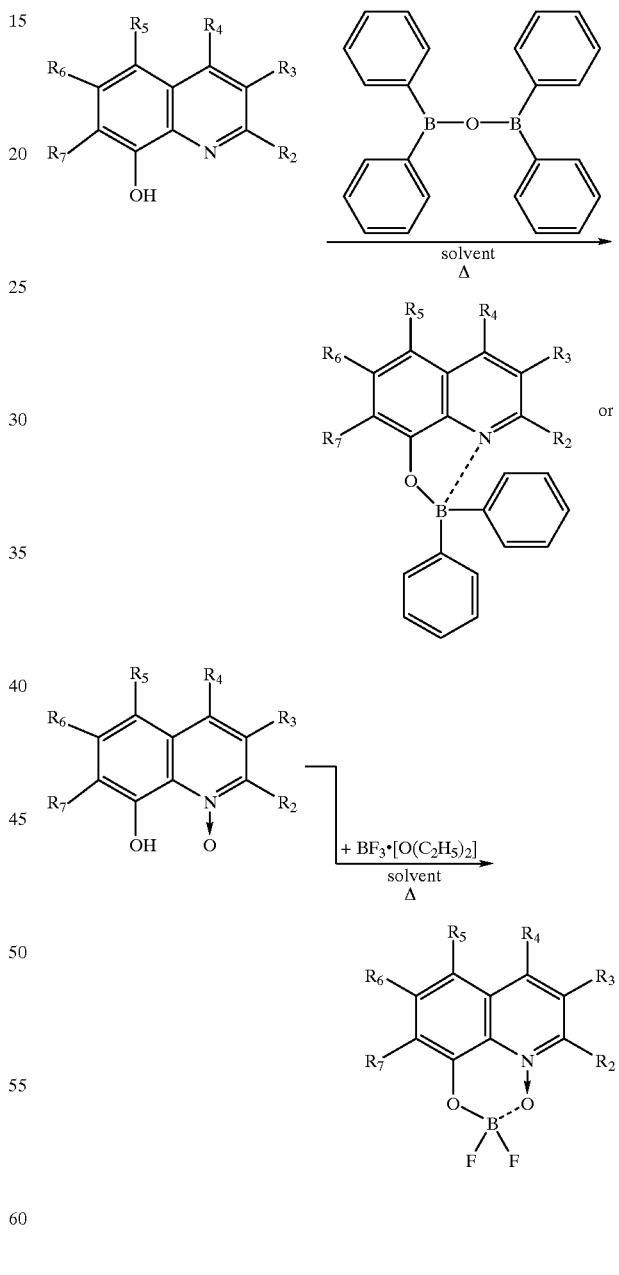

Examples of compounds (III) are the following:
B1) 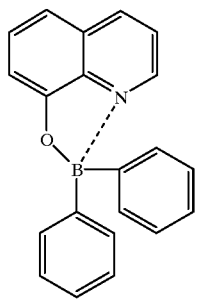
B2) 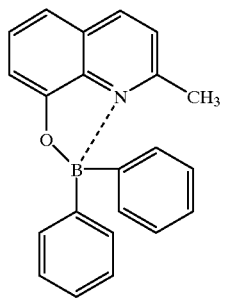
B3) 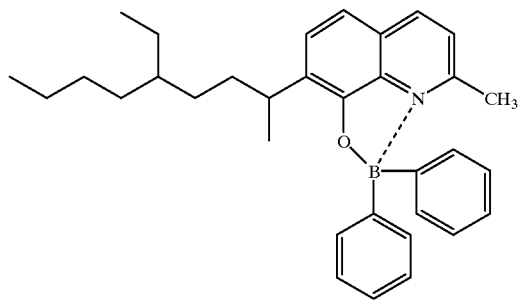
B4) 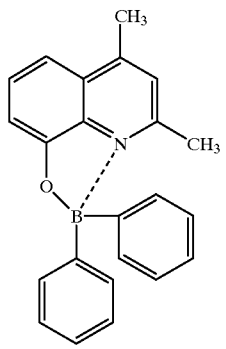
B5) 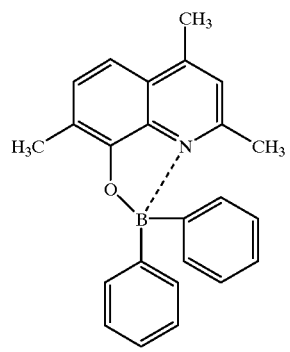
B6) 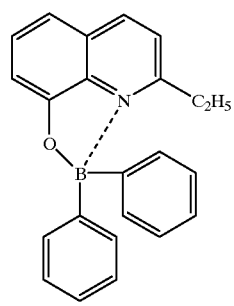
B7) 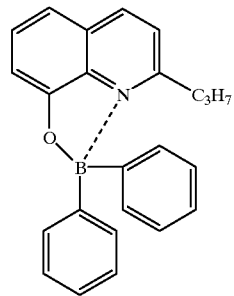
B8) 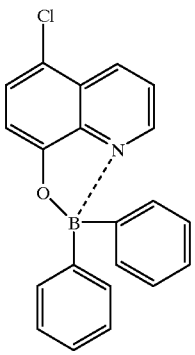

-continued
B9) 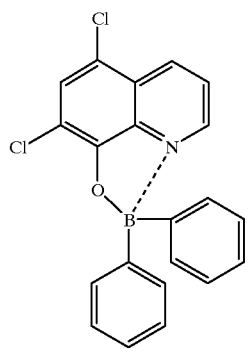
B10) 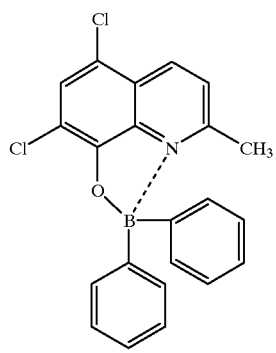
B10) 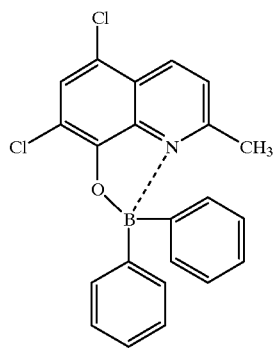
B11) 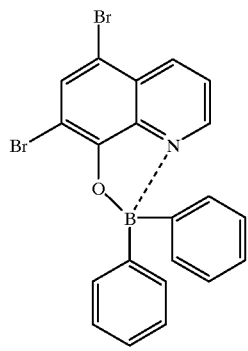
-continued
B12) 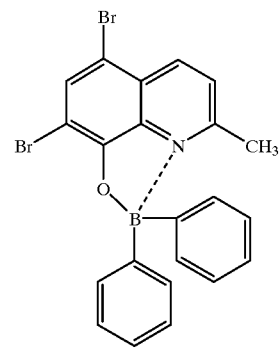
B13) 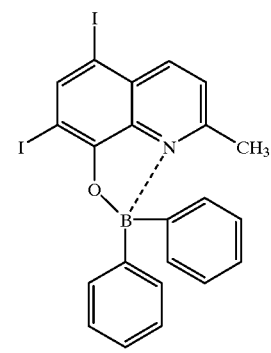
B14) 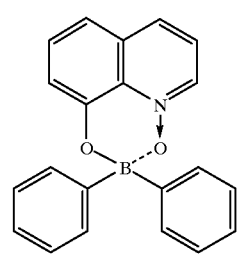
B15) 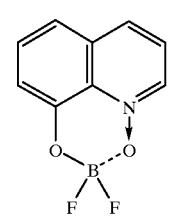

B16)
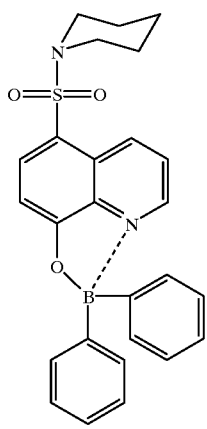

B17)
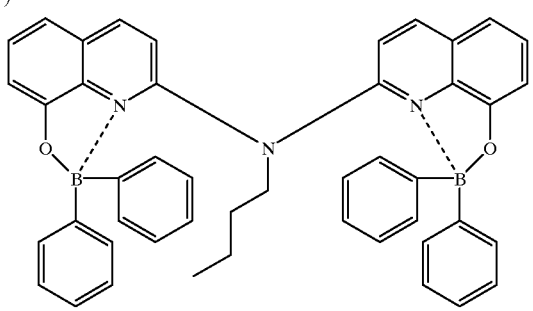

B18)
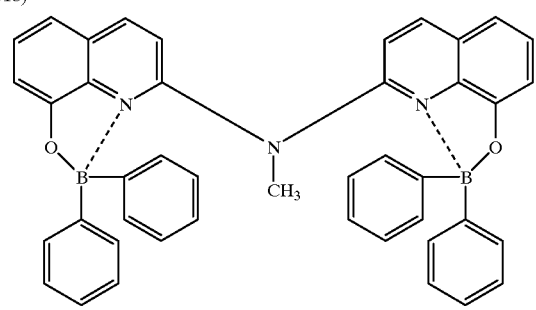

B19)
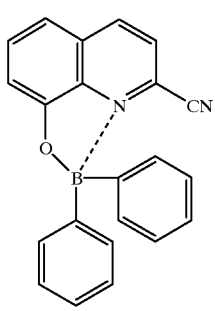

It is possible to use one or more compounds of the formulae B1 to B19.

Some of the 8-hydroxyquinoline ligands are commercially available or they can be prepared by known methods or organic chemistry (R. G. W. Hallingshead, Vol. 1, Chap.6, Butterworths, London (1954)).

To produce the electroluminescent element, the boron complex and, if desired, the tertiary amino compound and the binder are dissolved in a suitable solvent and applied to a suitable substrate by casting, doctor blade coating or spin coating. However, if desired, the boron complex can also be applied separately as a layer by a vapour deposition process. The substrate can be, for example, glass or a polymer material which is provided with a transparent electrode. As polymer material, it is possible to use, for example, a film of polycarbonate, polyester such as polyethylene terephthalate or polyethylene naphthalate, polysulphone or polyimide. Suitable transparent electrodes are a) metal oxides, e.g. indium-tin oxide (ITO), tin oxide (NESA), zinc oxide, doped tin oxide, doped zinc oxide, etc.,
b) semi-transparent metal films, e.g. Au, Pt, Ag, Cu etc.,
c) conductive polymer films such as polyanilines, polythiophenes, etc.

The metal oxide electrodes and the semitransparent metal film electrodes are applied in a thin layer by techniques such as vapour deposition, sputtering, platination, etc. The conductive polymer films are applied from the solution by techniques such as spin coating, casting, doctor blade coating, etc.

The thickness of the transparent electrode is from 3 nm to several $\mu$m, preferably from 10 nm to 500 nm.

The electroluminescent layer is applied as a thin film directly to the transparent electrode or to a charge transport layer which may be present. The thickness of the film is from 10 to 500 nm, preferably from 20 to 400 nm, particularly preferably from 50 to 250 nm.

A further charge transport layer may be inserted on the electroluminescent layer before application of a counterelectrode.

A listing of suitable intermediate charge transport layers, which may be hole conductor or electron conductor materials and may be present in polymeric or low molecular weight form, if desired as a blend, is given in EP-A 0 532 798. Particularly suitable charge transport materials are specifically substituted polythiophenes which have hole transport properties. They are described, for example, in EP-A 0 686 662.

The content of a low molecular weight hole conductor in a polymeric binder can be varied within the range from 2 to 97% by weight; the content is preferably from 5 to 95% by weight, particularly preferably from 10 to 90% by weight, in particular from 10 to 85% by weight. The hole injection or hole conduction zones can be deposited by various methods.

Film-forming hole conductors can also be used in pure form (100% hole conductor). If desired, the hole injection or hole conduction zone can also contain amounts of an electroluminescent substance.

Blends consisting entirely of low molecular weight compounds can be vapour-deposited; soluble and film-forming blends, which may contain a binder in addition to low molecular weight compounds, can be deposited from solution, e.g. by means of spin coating, casting or doctor blade coating.

It is also possible to apply emitting and/or electron-conducting substances in a separate layer on the hole conduction layer. Here, an emitting substance can also be added as dopant to the layer containing the compound (II) and, in addition, an electron-conducting substance can be applied. An electroluminescent substance can also be added to the electron injection or electron conduction layer.

The content of low molecular weight electron conductors in the polymeric binder can be varied within the range from 2 to 95% by weight; the content is preferably from 5 to 90% by weight, particularly preferably from 10 to 85% by weight. Film-forming electron conductors can also be used in pure form (100% electron conductor).

The counterelectrode comprises a conductive substance which may be transparent. Preference is given to metals, e.g. Al, Au, Ag, Mg, In, etc., or alloys and oxides of these, which can be applied by techniques such as vapour deposition, sputtering or platination.

The assembly of the invention is connected to a power source by means of two electric leads (e.g. metal wires) connected to the two electrodes.

On application of a DC potential in the range from 0.1 to 100 volt, the assemblies emit light having a wavelength of from 200 to 2000 nm. They display photoluminescence in the range from 200 to 2000 nm.

The assemblies of the invention are suitable for producing lighting units and units for the display of information.

EXAMPLES

Example 1

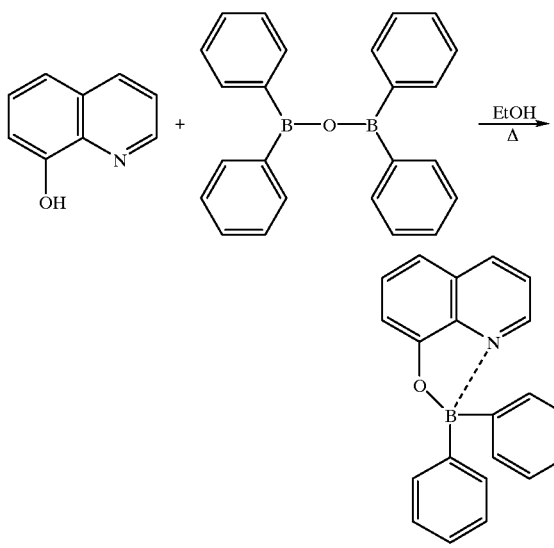

0.5 g (3.44 mmol) of freshly recrystallized 8-hydroxyquinoline and 1.19 g (3.44 mmol) of diphenylboric anhydride together with 120 ml of absolute ethanol are placed in a reaction vessel and refluxed for 2 hours under a protection $N_2$ atmosphere. After a few hours after cooling, a yellow solid precipitates from the solution which has a yellow-green fluorescence; this solid can subsequently be recrystallized from ethanol. After drying, 0.94 g (=88.4% of theory) of a solid having an intense yellow colour is obtained. This solid displays an intense yellow-green solid-state fluorescence and is sufficiently soluble in methanol.

Example 2

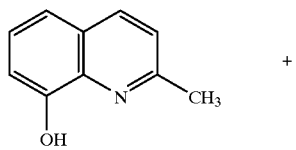

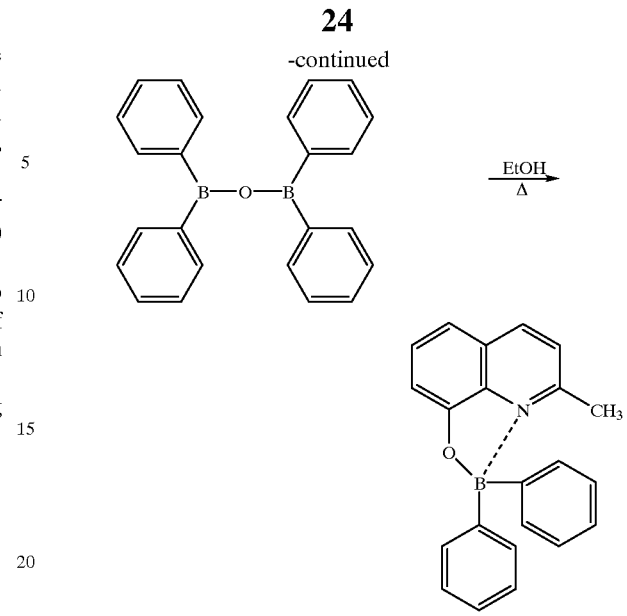

0.5 g (3.14 mmol) of freshly recrystallized 8-hydroxyquinaldine and 1.09 g (3.14 mmol) of diphenylboric anhydride together with 50 ml of absolute ethanol are placed in a reaction vessel and refluxed for 6 hours under a protection $N_2$ atmosphere. After a few hours after cooling, a yellow solid precipitates from the solution which has a yellow-green fluorescence; this solid can subsequently be recrystallized from ethanol. After drying, 0.9 g (=88.7% of theory) of a solid having an intense yellow colour is obtained. This solid displays an intense yellow-green solid-state fluorescence and is sufficiently soluble in methanol.

Example 3

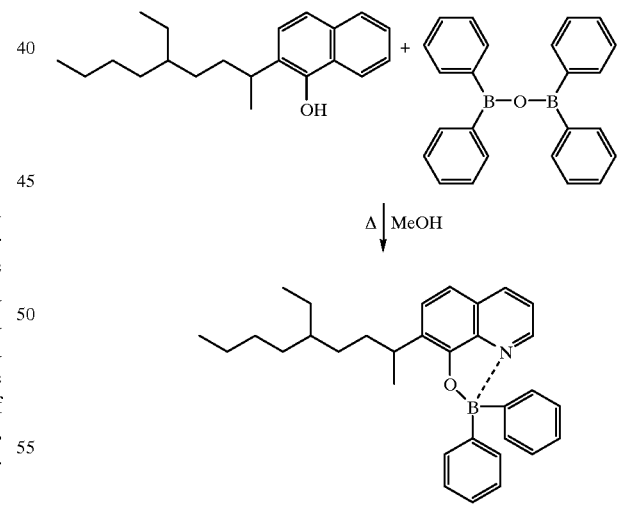

1 g (3.34 mmol) of 7-(4-ethyl-1-methyloctyl)-8-hydroxyquinoline which has previously been purified by column chromatography and 1.16 g (3.34 mmol) of diphenylboric anhydride together with 100 ml of absolute ethanol are placed in a reaction vessel and refluxed for 7 hours under a protective $N_2$ atmosphere. This gives a reaction mixture having a yellow-green fluorescence and this is evaporated on a rotary evaporator. After purification of the crude product by chromatography, 0.8 g (51% of theory) of the product which has an intense yellow-green fluorescence is obtained.

Example 4

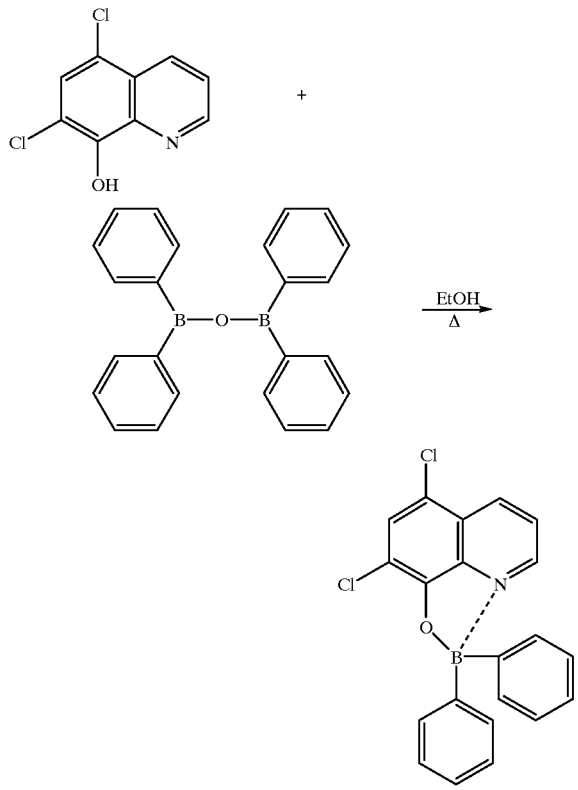

0.6 g (2.8 mmol) of freshly recrystallized 5,7-dichloro-8-hydroxyquinoline and 0.97 g (2.8 mmol) of diphenylboric anhydride together with 250 ml of absolute ethanol are placed in a reaction vessel and refluxed for 4 hours under a protection $N_2$ atmosphere. A yellow solid precipitates from the solution which has a yellow-green fluorescence; this solid can subsequently be recrystallized from ethanol. After drying, 1 g (≙94.5% of theory) of a solid having an intense yellow color is obtained. This solid displays an intense yellow-green solid-state fluorescence and is sufficiently soluble in methanol and ethanol.

Example 5

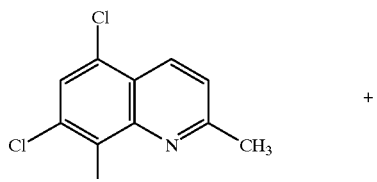

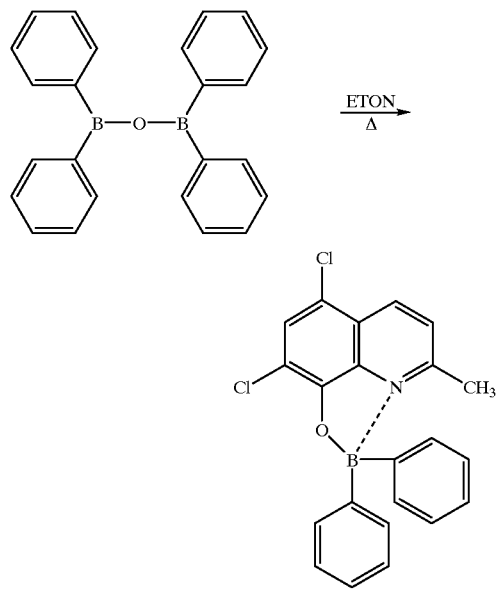

0.7 g (3.06 mmol) of freshly recrystallized 5,7-dichloro-8-hydroxyquinaldine and 1.06 g (3.06 mmol) of diphenylboric anhydride together with 100 ml of absolute ethanol are placed in a reaction vessel and refluxed for 8 hours under a protection $N_2$ atmosphere. A yellow solid precipitates from the solution which has a yellow-green fluorescence; this solid can subsequently be recrystallized from ethanol. After drying, 1.19 g (≙91.7% of theory) of a solid having an intense lemon yellow color is obtained. This solid displays an intense yellow-green solid-state fluorescence and is sufficiently soluble in methanol.

Example 6

1 g (2.78 mmol) of N-butyl-2,2'-imino-bis(8-hydroxyquinoline) and 1.92 g (5.56 mmol) of diphenylboric anhydride together with 50 ml of absolute methanol are placed in a reaction vessel and refluxed for 5 hours under a protection $N_2$ atmosphere. After a few hours after cooling, a lemon yellow solid precipitates from the solution which has a yellow fluorescence; this solid can subsequently be recrystallized from ethanol. After drying, 1.29 g (=67.5% of theory) of a solid having an intense lemon yellow color is obtained. This solid displays an intense yellow solid-state fluorescence and is sufficiently soluble in methanol.

Examples

Physical Part

Application Example 1

The substance B1 was dissolved in dichloroethane so that the absorbance at 400 nm in a 10 mm quartz cell is A=0.05. A fluorescence spectrum and an excitation spectrum were recorded on this solution using a fluorescence spectrometer (Edinburgh, FS900). The maximum of the excitation spectrum is at 372 nm, the maximum of the emission is at 500 nm. The quantum yield of the substance in dichloroethane on excitation at $\lambda_{ex}$=372 nm is φ=0.34.

Application Example 2

The procedure of Application Example 1 was repeated using the substance B2. The maximum of the excitation spectrum is at 372 nm, the maximum of the emission is at 500 nm. The quantum yield of the substance in dichloroethane on excitation at $\lambda_{ex}$=372 nm is φ=0.40.

Application Example 3

The procedure of Application Example 1 was repeated using the substance B9. The maximum of the excitation spectrum is at 410 nm, the maximum of the emission is at 533 nm. The quantum yield of the substance in dichloroethane on excitation at $\lambda_{ex}$=410 nm is φ=0.094.

Application Example 4

The procedure of Application Example 1 was repeated using the substance B 11. The maximum of the excitation spectrum is at 411 nm, the maximum of the emission is at 536 nm. The quantum yield of the substance in dichloroethane on excitation at $\lambda_{ex}$=411 nm is φ=0.056.

Application Example 5

The substance B1 according to the invention is used for making an organic light emitting diode (OLED). The following procedure was used for producing the OLED:
1. Cleaning the ITO substrate
    ITO-coated glass (Merck Balzers AG, FL, Part. No. 253 674 XO) is cut into 50 mm×50 mm pieces (substrates). The substrates are subsequently cleaned in a 3% strength aqueous Mukasol solution in an ultrasonic bath for 15 min. The substrates are then rinsed with distilled water and spun dry in a centrifuge. This rinsing and drying procedure is repeated 10 times.
2. Application of the ®Baytron P layer to the ITO
    About 10 ml of the 1.3% strength polyethylenedioxythiophene/polystyrenesulphonic acid solution (Bayer AG, Baytron P) are filtered (Millipore HV, 0.45 μm). The substrate is subsequently placed on a spin coater and the filtered solution is spread over the ITO-coated side of the substrate. The excess solution on the substrate is subsequently spun off by rotation of the plate at 500 rpm for 3 minutes. The substrate which has been coated in this way is then dried at 110° C. for 5 minutes on a hotplate. The thickness of the layer is 60 nm (Tencor, Alphastep 200).
3. Application of the hole conduction layer
    5 ml of a 1.5% strength dichloroethane solution of 1 part by weight of polyvinylcarbazole (BASF, Luvican), 1 part by weight of phenylamine (Agfa-Gevaert, Compound A1) and 1 part by weight of phenylamine (Agfa-Gevaert, A2) are filtered (Millipore HV, 0.45 μm) and spread on the dried Baytron P layer. The excess solution on the substrate is subsequently spun off by rotation of the plate at 800 rpm for 30 seconds. The substrate which has been coated in this way is then dried at 110° C. for 5 minutes on a hotplate. The total thickness of the layers is 150 nm.
4. Application of the light-emitting/electron-injecting layer by vapor deposition
    A third organic layer, namely the substance B1 according to the invention, is applied to the above two organic layers by thermal vapor deposition. This is carried out in a vapor deposition unit (Leybold, Univex 350). The pressure in the vapor deposition unit during the deposition procedure is $10^{-3}$ Pa and the deposition rate is 2 Å/sec. The total thickness of the 3 organic layers is 200 nm.
5. Application of the metal cathode by vapor deposition
    A metal electrode is applied to the organic layer system by vapor deposition. For this purpose, the substrate is placed with the organic layer system facing downwards on a perforated mask (hole diameter: 5 mm). At a pressure of $10^{-3}$ Pa, the elements Mg and Ag are vaporized in parallel from two vaporization boats. The deposition rate for Mg is 28 Å/sec. The thickness of the vapor-deposited metal contacts is 500 nm.

The two electrodes of the organic LED are connected to a voltage source by means of electric leads. The positive pole is connected to the ITO electrode and the negative pole is connected to the MgAg electrode.

From a voltage of only 2.5 volt, electroluminescence can be detected by means of a photodiode (EG&G C30809E). At a voltage of 6 volt, the current per unit area is 1 mA/cm$^2$ and the electroluminescence is readily visible. The color is (x=0.302; y=0.4).

Application Example 6

The substance B9 according to the invention is used for making an organic light emitting diode (OLED).

The production and the electric actuation of the OLED are carried out as described in Application Example 5, except that, as third organic layer, the substance B9 according to the invention is applied to the first two layers by thermal vapor deposition. This is carried out in a vapor deposition unit (Leybold, Univex 350). The pressure in the vapor deposition unit is $10^{-3}$ Pa during the deposition procedure and the deposition rate is 2 Å/sec. The total thickness of the 3 organic layers is 200 nm.

The two electrodes of the organic LED are connected to a voltage source by means of the electric leads. The positive pole is connected to the ITO electrode and the negative pole is connected to the MgAg electrode.

From a voltage of only 2.5 volt, electroluminescence can be detected by means of a photodiode (EG&G C30809E). At a voltage of 4 volt, the current per unit area is 1 mA/cm$^2$ and the electroluminescence is readily visible. The color is (x=0.412; y=0.482).

Application Example 7

The substance B8 according to the invention is used for making an organic light emitting diode (OLED).

The production and the electric actuation of the OLED are carried out as described in Application Example 5, except that, as third organic layer, the substance B8 according to the invention is applied to the first two layers by thermal vapor deposition. This is carried out in a vapor deposition unit (Leybold, Univex 350). The pressure in the vapor deposition unit is $10^{-3}$ Pa during the deposition procedure and the deposition rate is 2 Å/sec. The total thickness of the 3 organic layers is 200 nm.

From a voltage of 4.5 volt, electroluminescence can be detected by means of a photodiode (EG&G C30809E). At a voltage of 12 volt, the current per unit area is 1 mA/cm² and the electroluminescence is readily visible. The color of the electroluminescence is greenish blue.

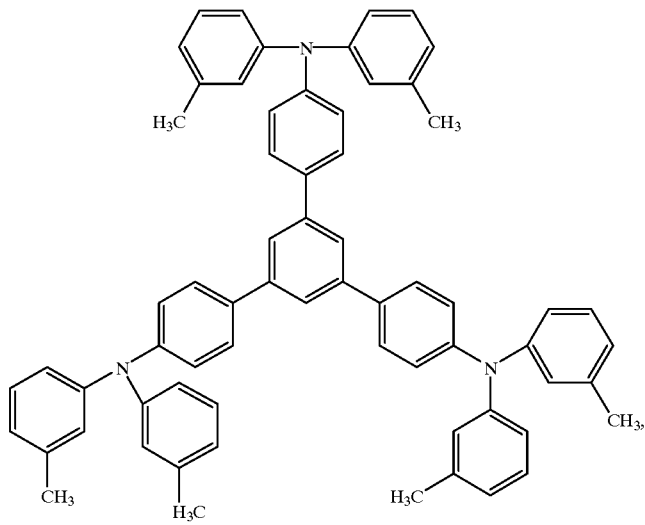

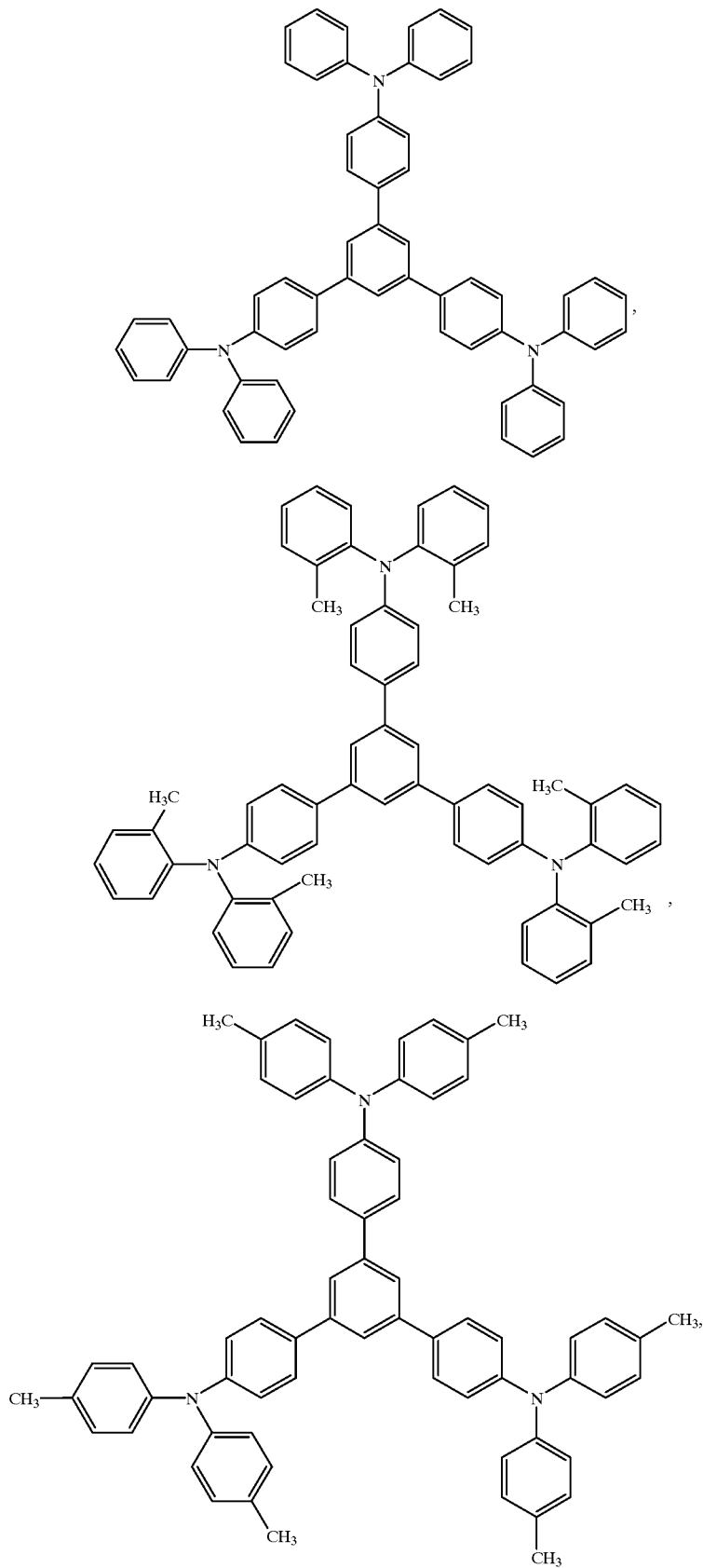

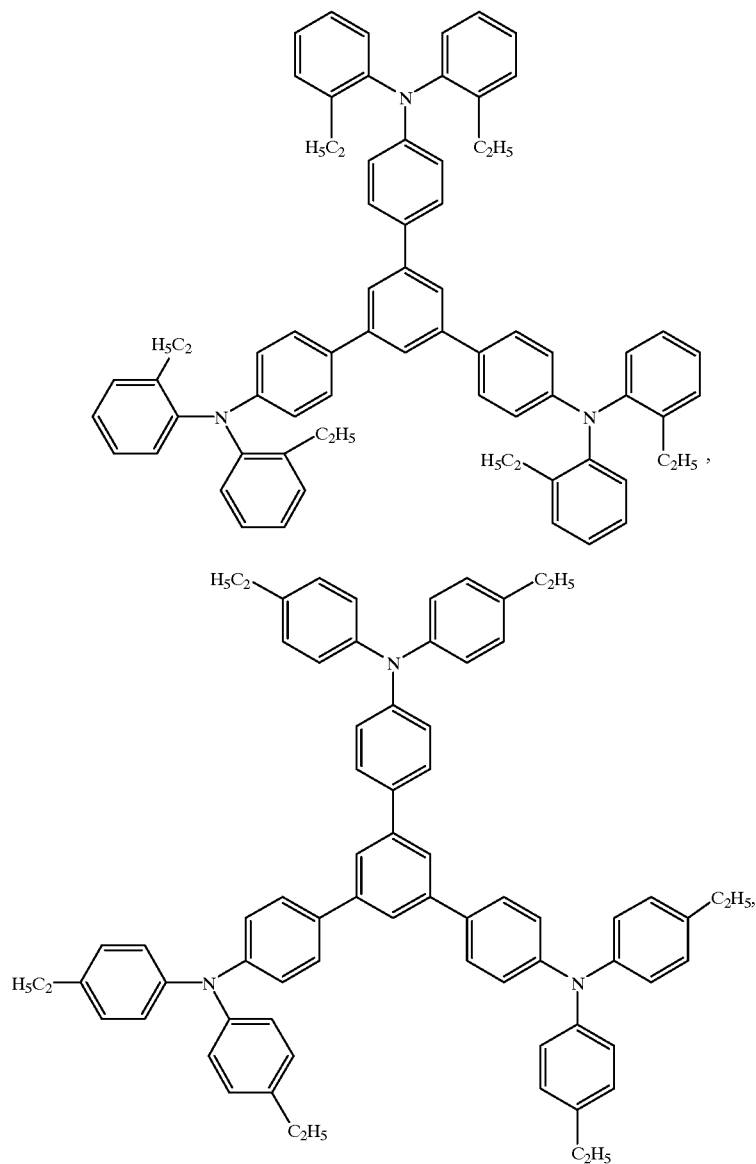

What is claimed is:

1. An electroluminescent assembly comprising a substrate, an anode, an electroluminescent element, and a cathode, wherein (1) at least one of the anode and/or cathode is transparent in the visible spectral region, and (2) the electroluminescent element contains a boron complex of an 8-hydroxyquinoline derivative and consists of one or more zones selected from the group consisting of a hole injection zone, a hole transport zone, an electroluminescent zone, an electron transport zone, and an electron injection zone arranged in the order listed, with the proviso that each said zone can optionally assume functions of other such zones such that the electro-luminescent element as a whole exhibits hole-injecting, hole-transporting, electroluminescent, electron-transporting, and electron-injecting functions, wherein the hole injection zone must be present and contains (i) an uncharged or cationic polythiophene having the formula (I)

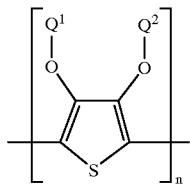

wherein $Q^1$ and $Q^2$ independently represent hydrogen or substituted or unsubstituted $(C_1-C_{20})$-alkyl, $CH_2OH$, or $(C_6-C_{14})$-aryl or $Q^1$ and $Q^2$ together represent $-(CH_2)_m-CH_2-$, wherein m is 0 to 12, or $(C_6-C_{14})$-arylene, and n represents an integer from 2 to 10,000, or (ii) one or more uncharged or cationic polythiophenes of the formulas (Ia) and/or (Ib)

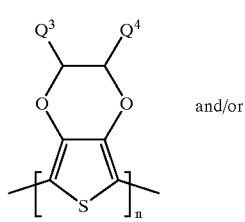

(Ia)

and/or

(Ib)

wherein $Q^3$ and $Q^4$ independently represent hydrogen or a substituted or unsubstituted $(C_1-C_{18})$-alkyl, $(C_2-C_{12})$-alkenyl, $(C_3-C_7)$-cycloalkyl, $(C_7-C_{15})$-aralkyl, $(C_6-C_{10})$-aryl, $(C_1-C_{18})$-alkyloxy, or $(C_2-C_{18})$-alkyloxy ester group, $Q^5$ and $Q^6$ independently represent hydrogen or a $(C_1-C_{18})$-alkyl, $(C_2-C_{12})$-alkenyl, $(C_3-C_7)$-cycloalkyl, $(C_7-C_{15})$-aralkyl, $(C_6-C_{10})$-aryl, $(C_1-C_{18})$-alkoxy, or $(C_2-C_{18})$-alkyloxy ester group substituted by at least one sulphonate group, with the proviso that $Q^5$ and $Q^6$ cannot both be hydrogen, and n represents an integer from 2 to 10,000.

2. An electroluminescent assembly according to claim 1 wherein the hole injection zone contains one or more uncharged or cationic polythiophenes of the formulas (Ia-1) and/or (Ib-1)

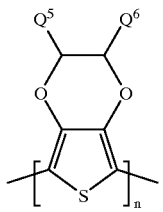

(Ia-1)

and/or

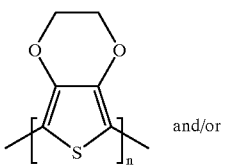

(Ib-1)

wherein $Q^5$ represents a $(C_1-C_{18})$-alkyl, $(C_2-C_{12})$-alkenyl, $(C_3-C_7)$-cycloalkyl, $(C_7-C_{15})$-aralkyl, $(C_6-C_{10})$-aryl, $(C_1-C_{18})$-alkoxy, or $(C_2-C_{18})$-alkyloxy ester group substituted by at least one sulphonate group, and n represents an integer from 2 to 10,000.

3. An electroluminescent assembly according to claim 1 additionally comprising polyanions selected from the group consisting of polymeric carboxylic acids, polymeric sulphonic acids, and mixtures thereof in the hole injection zone.

4. An electroluminescent assembly according to claim 1 additionally comprising counterions selected from the group consisting of polystyrene sulphonic acids, alkaline earth metal salts, and mixtures thereof in the hole injection zone.

5. An electroluminescent assembly according to claim 1 wherein the hole injection zone and/or the hole transport zone contains an aromatic tertiary amino compound having the formula (II)

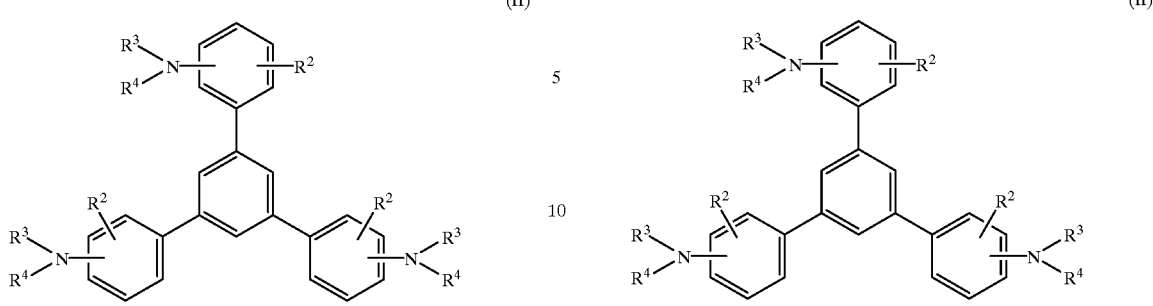

(II)

wherein

R² represents hydrogen, substituted or unsubstituted alkyl, or halogen, and

R³ and R⁴ independently represent substituted or unsubstituted ($C_1$–$C_{10}$)-alkyl, alkoxycarbonyl-substituted ($C_1$–$C_{10}$)-alkyl, or substituted or unsubstituted aryl, aralkyl, or cycloalkyl.

6. An electroluminescent assembly according to claim 1 wherein the hole injection zone and/or the hole transport zone contains an aromatic tertiary amino compound having the formula (II)

wherein
R² represents hydrogen or ($C_1$–$C_6$)-alkyl, and
R³ and R⁴ independently represent ($C_1$–$C_6$)-alkyl, ($C_1$–$C_4$)-alkoxycarbonyl-($C_1$–$C_6$)-alkyl, unsubstitued phenyl, naphthyl, phenyl-($C_1$–$C_4$)-alkyl, naphthyl-($C_1$–$C_4$)-alkyl, cyclopentyl, or cyclohexyl, ($C_1$–$C_4$)-alkyl-substituted phenyl, naphthyl, phenyl-($C_1$–$C_4$)-alkyl, naphthyl-($C_1$–$C_4$)-alkyl, cyclopentyl, or cyclohexyl, or ($C_1$–$C_4$)-alkoxy-substituted phenyl, naphthyl, phenyl-($C_1$–$C_4$)-alkyl, naphthyl-($C_1$–$C_4$)-alkyl, cyclopentyl, or cyclohexyl.

7. An electroluminescent assembly according to claim 1 wherein the hole injection zone and/or the hole transport zone contains one or more aromatic tertiary amino compounds selected from the group consisting of compounds having the formulas